United States Patent
Tsao et al.

(10) Patent No.: US 8,080,881 B2
(45) Date of Patent: Dec. 20, 2011

(54) CONTACT PAD SUPPORTING STRUCTURE AND INTEGRATED CIRCUIT FOR CRACK SUPPRESION

(75) Inventors: Sheng-Hsiung Tsao, Hsinchu County (TW); Yung-Lung Lin, Hsinchu (TW); Yun-Lung Huang, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 290 days.

(21) Appl. No.: 12/431,636

(22) Filed: Apr. 28, 2009

(65) Prior Publication Data
US 2010/0176515 A1    Jul. 15, 2010

(30) Foreign Application Priority Data
Jan. 12, 2009   (TW) ............................... 98100909 A

(51) Int. Cl.
*H01L 23/48*   (2006.01)
*H01L 23/52*   (2006.01)
*H01L 29/40*   (2006.01)

(52) U.S. Cl. ......... 257/774; 257/781; 257/786; 257/758; 257/773; 257/700; 438/622; 438/629; 438/666; 438/614; 438/637

(58) Field of Classification Search ............ 257/758, 257/786, 780, 781, 602, 734, 700, 503, 459, 257/784, 774, 773, 621, 690; 438/622, 629, 438/666, 614, 639, 637
See application file for complete search history.

(56) References Cited

U.S. PATENT DOCUMENTS
5,739,587 A * 4/1998 Sato ............................ 257/758
2008/0246152 A1* 10/2008 Liu et al. ....................... 257/758
* cited by examiner

*Primary Examiner* — Ha Tran T Nguyen
*Assistant Examiner* — Thanh Y Tran

(57) ABSTRACT

The invention provides a contact pad supporting structure. The contact pad supporting structure includes an underlying first conductive plate and an overlying second conductive plate, wherein the first and second conductive plates are separated by a first dielectric layer. A plurality of circular ring-shaped via plug groups comprising a plurality of circular ring-shaped via plugs is through the first dielectric layer, electrically connecting to the first and second conductive plates. All of the circular ring-shaped via plugs of each of the circular ring-shaped via plug groups are disorderly arranged.

18 Claims, 5 Drawing Sheets

CONTACT PAD SUPPORTING STRUCTURE AND INTEGRATED CIRCUIT FOR CRACK SUPPRESION

CROSS REFERENCE TO RELATED APPLICATIONS

This Application claims priority of Taiwan Patent Application No. 98100909, filed on Jan. 12, 2009, the entirety of which is incorporated by reference herein.

BACKGROUND OF THE INVENTION

1. Field of the Invention

The present invention relates to an integrated circuit, and in particular, to a contact pad supporting structure of an integrated circuit.

2. Description of the Related Art

Power, grounding or input/output (I/O) connections for elements and devices of integrated circuits are provided by contact pads. Also, contact pads can be used for bonding or device testing of integrated circuits. However, as dimensions of integrated circuits shrink and density thereof increases, difficulty in providing efficient functioning and reliable contact pads have increased.

FIGS. 1A and 1B schematically show arrangements of via holes 110 of a conventional contact pad supporting structure 150. The conventional contact pad supporting structure 150 is disposed on a semiconductor substrate 100, wherein the conventional contact pad supporting structure 150 and the semiconductor substrate 100 are separated by an inter metal dielectric (IMD) layer 104. The conventional contact pad supporting structure 150 comprises a metal layer 106, an IMD layer 108, a contact pad metal layer 112 and a plurality of circular-shaped via plugs 110 through the IMD layer 108, wherein the metal layer 106 and the contact pad metal layer 112 are separated by the IMD layer 108, and wherein the via plugs 110 are electrically connected to the contact pad metal layer 112 and the metal layer 106. The circular-shaped via plugs 110 are periodically arranged. However, each of the via plugs 110 and the two via plugs on the opposite sides adjacent thereof have a same spacing. Also, the via plugs 110, substantially along one direction, are periodically arranged.

For the conventional contact pad supporting structure 150, deficiencies exist. Specifically, when a large bonding force or device testing stress is placed on the conventional contact pad supporting structure 150, a continuous cracking path 160 along the periodically arranged via plugs 110 of the dielectric layer 108 under the contact pad metal layer 112 may occur. The continuous cracking path 160 results in reduced reliability of the contact pads, thus, making it difficult to further decrease testing costs and reduce fabrication yields. Additionally, the conventional contact pad supporting structure 150 has weak mechanical strength, and thus, circuits are not able to be designed and disposed below the contact pad areas, hindering efficient use of space for integrated circuits.

Therefore, a contact pad supporting structure having better mechanical strength, and able to withstand a large bonding force or device testing stress is needed to further reduce device testing costs of integrated circuits and improve fabrication yields.

BRIEF SUMMARY OF INVENTION

To solve the above-described problems, a contact pad supporting structure is provided. An exemplary embodiment of a contact pad supporting structure comprises an underlying first conductive plate and an overlying second conductive plate, wherein the first and second conductive plates are separated by a first dielectric layer. A plurality of circular ring-shaped via plug groups comprising a plurality of circular ring-shaped via plugs is through the first dielectric layer, electrically connecting to the first and second conductive plates. All of the circular ring-shaped via plugs of each of the circular ring-shaped via plug groups are disorderly arranged.

An exemplary embodiment of an integrated circuit comprises a semiconductor substrate. A contact pad supporting structure is disposed over the semiconductor substrate, wherein the contact pad supporting structure comprises an underlying first conductive plate and the overlying second conductive plate, and the first and second conductive plates are separated by a first dielectric layer. A plurality of circular ring-shaped via plug groups comprise a plurality of circular ring-shaped via plugs vertically through the first dielectric layer, electrically connecting to the first and second conductive plates, wherein all of the circular ring-shaped via plugs of each of the circular ring-shaped via plug groups are disorderly arranged.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

Figure 1A:
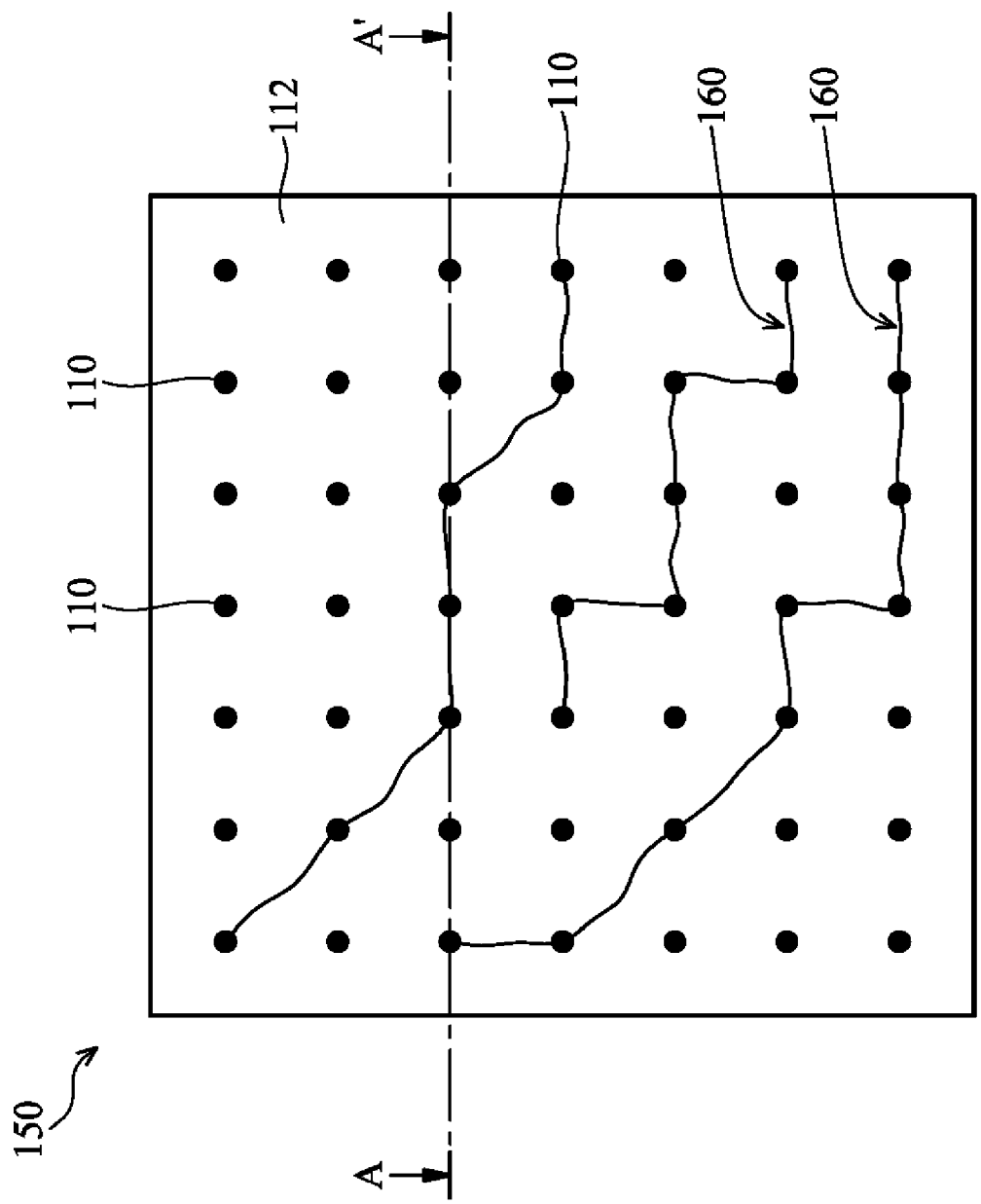
FIGS. 1A and 1B schematically show arrangements of via holes of a conventional contact pad supporting structure.
Figure 1B:
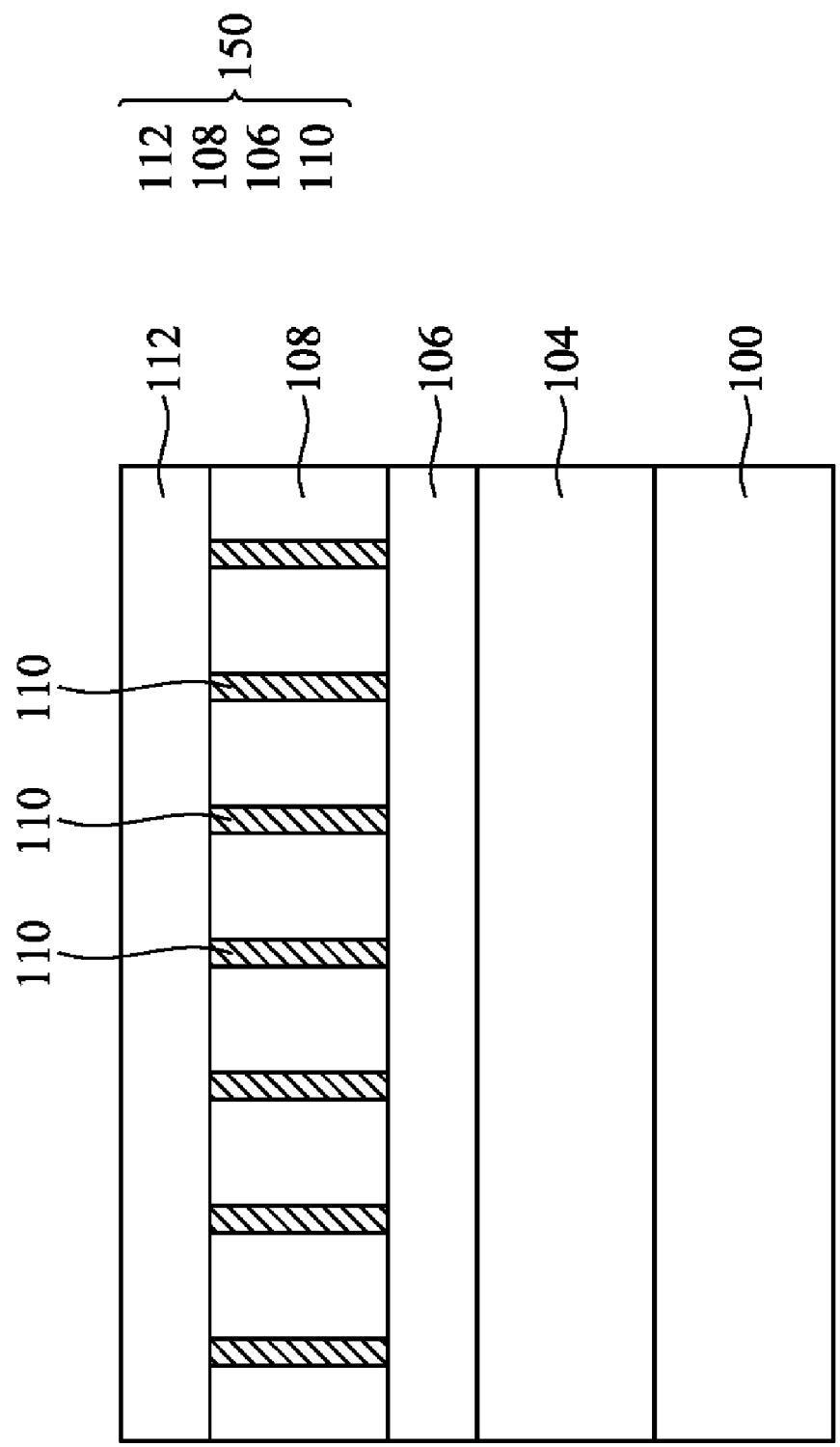

The following description is of a mode for carrying out the invention. This description is made for the purpose of illustrating the general principles of the invention and should not be taken in a limiting sense. The scope of the invention is best determined by reference to the appended claims. Wherever possible, the same reference numbers are used in the drawings and the descriptions to refer the same or like parts.

The present invention will be described with respect to particular embodiments and with reference to certain drawings, but the invention is not limited thereto and is only limited by the claims. The drawings described are only schematic and are non-limiting. In the drawings, the size of some of the elements may be exaggerated and not drawn to scale for illustrative purposes. The dimensions and the relative dimensions do not correspond to actual dimensions to practice of the invention.

Figure 2A:
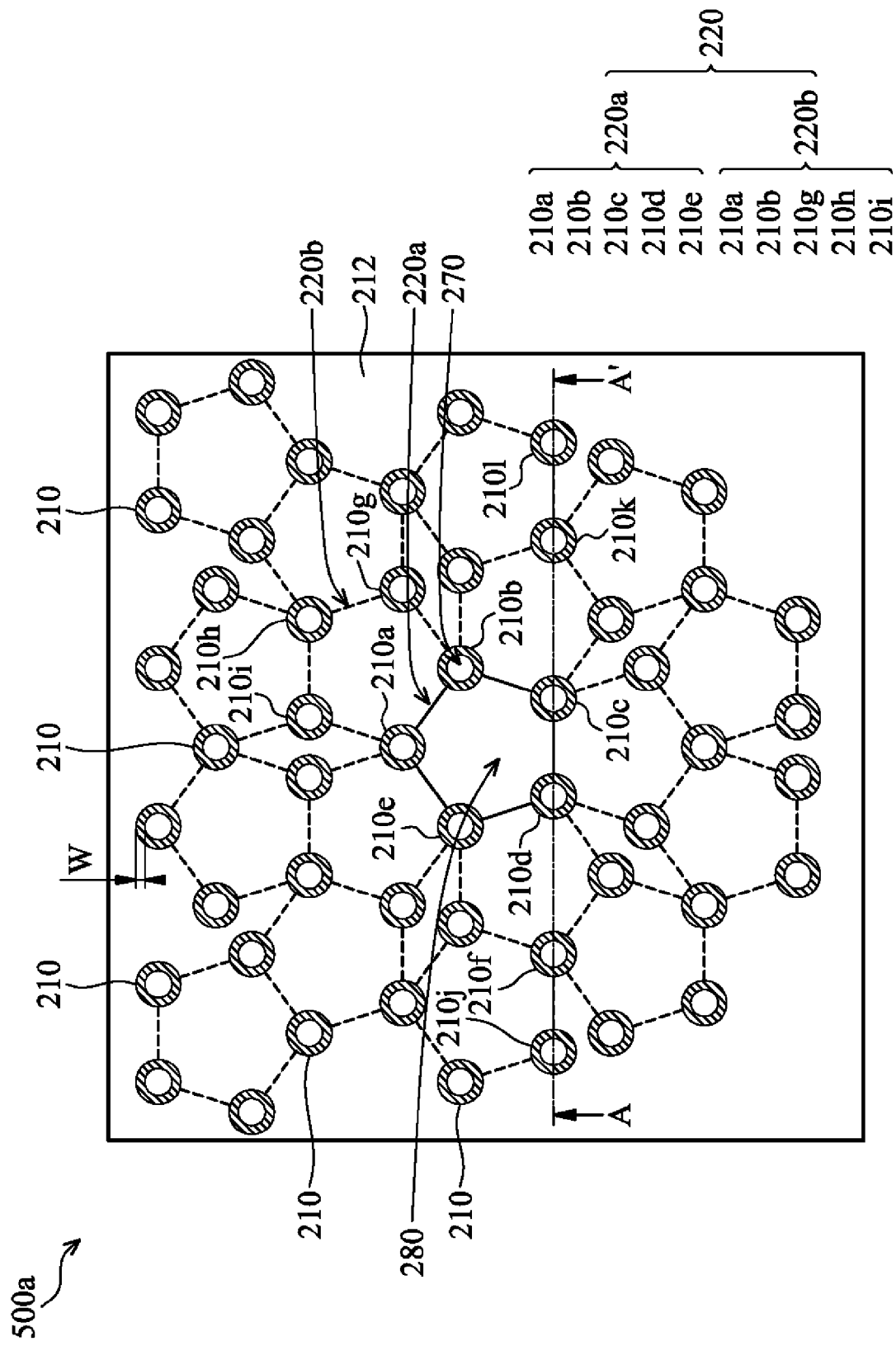
FIG. 2A is a top view of one exemplary embodiment of a contact pad supporting structure of the invention showing arrangements of circular ring-shaped via plug groups.
Figure 2B:
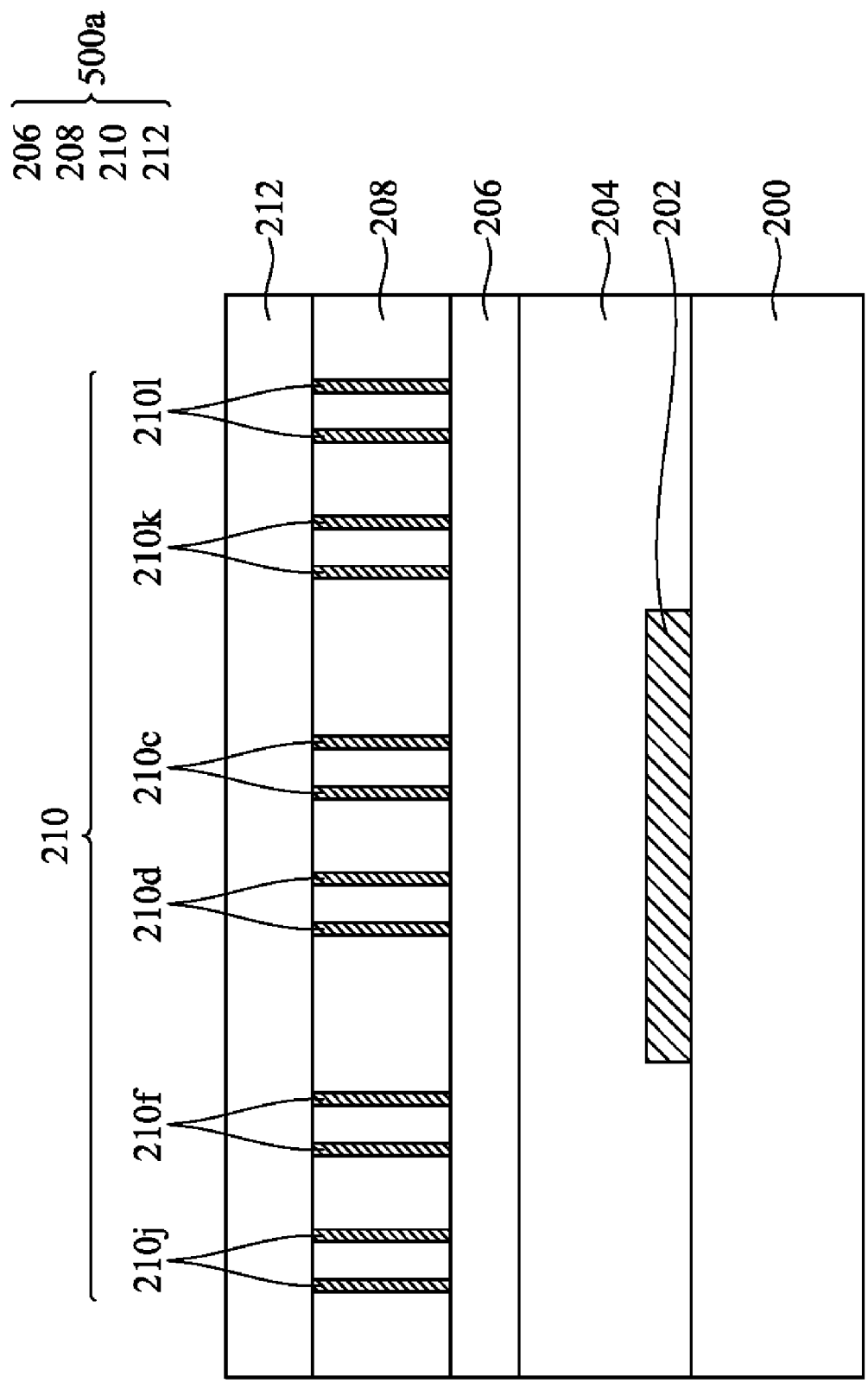
FIG. 2B is a cross section view along line A-A' of FIG. 2A showing one exemplary embodiment of a contact pad supporting structure of the invention.

FIG. 2A is a top view of one exemplary embodiment of a contact pad supporting structure 500a of the invention showing arrangements of circular ring-shaped via plug groups 220. Arrangements of the circular ring-shaped via plug groups 220 are illustrated with solid lines in FIG. 2A. FIG. 2B is a cross section view along line A-A' of FIG. 2A showing one exemplary embodiment of an integrated circuit comprising a contact pad supporting structure 500a of the invention. As shown in FIGS. 2A and 2B, one exemplary embodiment of a contact pad supporting structure 500a comprises a semiconductor substrate 200. The semiconductor substrate 200 may comprise silicon. In alternative embodiments, SiGe, bulk semiconductor, strained semiconductor, compound semiconductor, silicon on insulator (SOI), and other commonly used semiconductor substrates can be used for the semiconductor substrate 200. The semiconductor substrate 200 may have a desired conductive type by implanting P-type or N-type impurities. In one embodiment, a power circuit 202 may be optionally disposed on the semiconductor substrate 200. In alternative embodiments, the power circuit 202 may comprise a circuit constructed by discrete circuit devices such as transistors, diodes, capacitors, resistors, inductors or other active or passive devices. A dielectric layer 204 is disposed on the semiconductor substrate 200, covering the power circuit 202. In one embodiment, the dielectric layer 204 may comprise inter metal dielectric (IMD) formed by materials comprising $SiO_2$, $SiN_x$, SiON, PSG, BPSG, F-containing $SiO_2$ or other low-k dielectric materials with a dielectric constant (k) of less than 3.9. In alternative embodiments, the dielectric layer 204 may comprise spin-on inorganic dielectrics, spin-on organic dielectrics, porous dielectric materials, organic polymers, organic silica glasses, fluorinated silicate glass (FSG), diamond-like carbon, hydrogen silsesquioxane (HSQ), methyl silsesquioxane (MSQ) or porous organic materials. The dielectric layer 204 may be formed by spin-coating, chemical vapor deposition (CVD), physical vapor deposition (PVD) or plating.

As shown in FIGS. 2A and 2B, the contact pad supporting structure 500a is disposed over the semiconductor substrate 200 and on the dielectric layer 204. The contact pad supporting structure 500a comprises an underlying first conductive plate 206 and an overlying second conductive plate 212, wherein the first and second conductive plates 206 and 212 are separated by a dielectric layer 208. The second conductive plate 212 of the contact pad supporting structure 500a may serve as a contact pad with an exposed surface providing a region comprising bonding areas and device testing areas, wherein the second conductive plate 212 may be electrically connected to a metal contact pad and a bonding wire. In one embodiment, the second conductive plate 212 may be a top level metal layer (e.g., the uppermost metal layer) of an integrated circuit, the first conductive plate 206 may be another metal layer level underlying the top level metal layer. A dielectric layer 208 may be a top level IMD layer (e.g., the uppermost IMD layer). In alternative embodiments, the first conductive plate 206 and the second conductive plate 212 may be IMD layers at other levels. The first conductive plate 206 and the second conductive plate 212 may comprise Al, Al alloys, Cu, Cu alloys or other copper based conductive materials. The dielectric layer 208 may have the same materials with the dielectric layer 204.

As shown in FIGS. 2A and 2B, the contact pad supporting structure 500a comprises a plurality of circular ring-shaped via plug groups 220 comprising a plurality of circular ring-shaped via plugs 210 vertically through the dielectric layer 208, electrically connecting to the first and second conductive plates 206 and 212. In one embodiment, the circular ring-shaped via plugs 210 may be top level via plugs of the integrated circuit (e.g., the uppermost via plugs). In alternative embodiments, the circular ring-shaped via plugs 210 may be via plugs in other levels. The circular ring-shaped via plugs 210 may comprise W, Al, Cu or alloys thereof. In one embodiment, the circular ring-shaped via plugs 210 may have a same size, wherein the circular ring-shaped via plugs 210 have a uniform width W larger or equal to the critical dimension of the via holes defined by design rules. As shown on FIG. 2A, the circular ring-shaped via plug 210 encloses a portion of the dielectric layer 208, thereby forming an enclosed region 270. When a large bonding force or device testing stress is place on the contact pad supporting structure 500a, the circular ring-shaped via plug 210 hinders cracking paths forming in the enclosed region 270 of the dielectric layer 208 and propagating substantially along a boundary between the dielectric layer 208 and the circular ring-shaped via plug 210. Additionally, as shown in FIG. 2A, all circular ring-shaped via plugs 210 of each of the circular ring-shaped via plug groups 220 are disorderly arranged. That is, each of the circular ring-shaped via plug 210 and the two circular ring-shaped via plugs on opposite sides adjacent thereof may have different spacing. Specifically, centers of each of the circular ring-shaped via plugs and centers of the opposing two circular ring-shaped via plugs may be not disposed along a same line. As shown in FIG. 2B, the circular ring-shaped via plugs 210 of each of the circular ring-shaped via plug groups 220, which are substantially along a direction, are disorderly arranged. Note that the arrangements, numbers of arrangements or arranging directions of the circular ring-shaped via plugs 210 of the circular ring-shaped via plug groups 220 are according to design rules, and is not limited to the disclosure herein. For example, the five circular ring-shaped via plugs 210a, 210b, 210c, 210d and 210e may constitute a circular ring-shaped via plug group 220a, arranged in a pentagon-like shape with five vertices. Also, the circular ring-shaped via plugs 210a, 210b and the other circular ring-shaped via plugs 210g, 210h and 210i may constitute another pentagon-shaped circular ring-shaped via plug group 220b. The contact pad supporting structure 500a may comprise a plurality of circular ring-shaped via plug groups 220, wherein each of the circular ring-shaped via plugs 210 of the circular ring-shaped via plug groups 220a or 220b and the two circular ring-shaped via plugs on opposite sides adjacent thereof may be alternatively arranged. Thus, as shown in FIG. 2A, when a large bonding force or device testing stress is place on the contact pad supporting structure 500a, the circular ring-shaped via plug 210 hinders cracking paths forming in the enclosed region 270 of the dielectric layer 208, and propagating substantially along a boundary between the dielectric layer 208 and the circular ring-shaped via plug 210. Additionally, the via plugs of the contact pad supporting structure of the invention are fully filled with filling materials as the circular ring-shaped via plug 210 has a uniform width W, unlike the via plugs of conventional contact pad supporting structures.

One exemplary embodiment of a contact pad supporting structure 500a of the invention, effectively improves the mechanical strength of the bonding pads. When a large bonding force or device testing stress is place on the contact pad supporting structure 500a, the contact pad supporting structure 500a hinders cracking paths forming in the dielectric layer 208. Therefore, the power circuit 202 as shown in FIG. 2A may be disposed in a region directly under the contact pad supporting structure 500a. That is, the power circuit 202 may be disposed in the circuits under pad (CUP) region. Thus, the contact pad supporting structure of the invention does not hinder efficient use of space for integrated circuits, allowing for further miniaturization or increased functionality.

Figure 3:
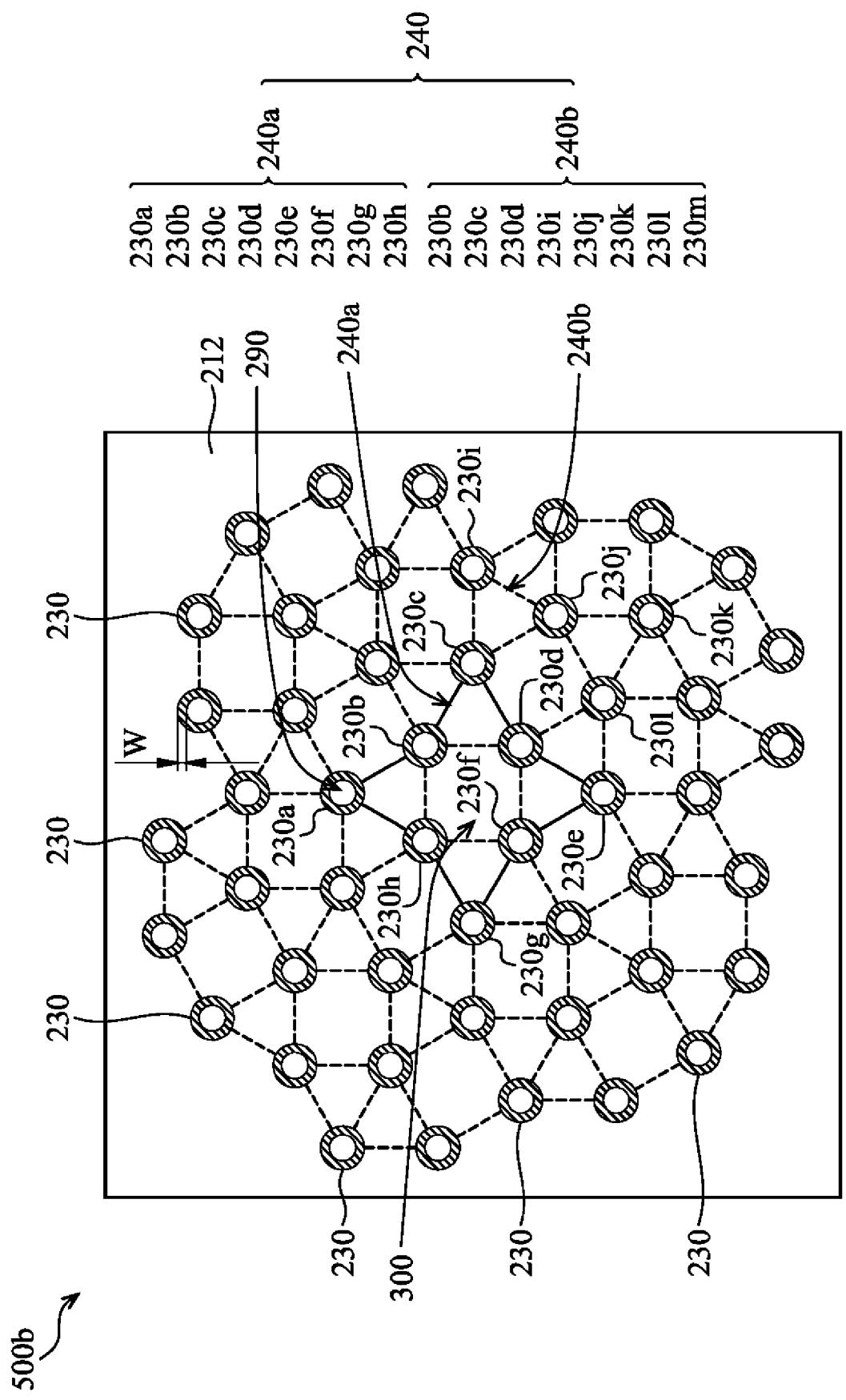
FIG. 3 is a top view of another exemplary embodiment of a contact pad supporting structure of the invention showing other arrangements of circular ring-shaped via plug groups.

FIG. 3 is a top view of another exemplary embodiment of a contact pad supporting structure 500b of the invention showing arrangements of circular ring-shaped via plug groups 240. Note that the circular ring-shaped via plug groups 240 are disposed through the dielectric layer 208 as shown in FIG. 2B. In one embodiment, the circular ring-shaped via plugs 230 may have a same size, wherein the circular ring-shaped via plugs 230 may have a uniform width W larger or equal to the critical dimension of via holes defined by the design rules. The circular ring-shaped via plug 230 encloses a portion of the dielectric layer 208 as shown in FIG. 2B, thereby forming an enclosed region 290. Thus, when a large bonding force or device testing stress is place on the contact pad supporting structure 500b, the circular ring-shaped via plug 230 hinders cracking paths forming in the enclosed region 290 of the dielectric layer 208, and propagating substantially along a boundary between the dielectric layer 208 as shown in FIG. 2B and the circular ring-shaped via plugs 230. As shown in FIG. 3, a circular ring-shaped via plug group 240a may comprise at least eight circular ring-shaped via plugs 230a, 230b, 230c, 230d, 230e, 230f, 230g and 230h, wherein the eight circular ring-shaped via plugs are arranged in a star-liked shape with eight vertices and four points. Also, the circular ring-shaped via plugs 230b, 230c, 230d and the other five circular ring-shaped via plugs 230i, 230j, 230k, 230l and 230e may constitute another star-shaped circular ring-shaped via plug group 240b with 4 points. The contact pad supporting structure 500b comprising a plurality of circular ring-shaped via plug groups 240, wherein each of the circular ring-shaped via plugs 230 of the circular ring-shaped via plug groups 240a or 240b and the two circular ring-shaped via plugs on opposite sides adjacent thereof may be alternatively arranged. Thus, when a large bonding force or device testing stress is place on the contact pad supporting structure 500b, the circular ring-shaped via plug groups 240 hinder cracking paths forming in an area among the circular ring-shaped via plugs 230, for example, an area 300 (a region enclosed by the circular ring-shaped via plugs 230b, 230d, 230f and 230h), of the dielectric layer and propagating substantially along a boundary between the dielectric layer and the circular ring-shaped via plugs 230 by other circular ring-shaped via plugs 230.

In alternative embodiments, the arrangements, numbers of arrangements or arranging directions of the circular ring-shaped via plugs of each of the circular ring-shaped via plug groups are according to design rules, and is not limited to the disclosure herein. All of the circular ring-shaped via plugs of each of the circular ring-shaped via plug groups are disorderly arranged. That is, each of the circular ring-shaped via plug and the two circular ring-shaped via plugs on opposite sides adjacent thereof may have different spacing. Additionally, centers of each of the circular ring-shaped via plugs and centers of the opposing two circular ring-shaped via plugs may be not disposed along a same line. Moreover, the circular ring-shaped via plugs of each of the circular ring-shaped via plug groups 240, which are substantially along a direction, are disorderly arranged.

One exemplary embodiment of an integrated circuit of the invention may comprise a contact pad supporting structure 500a or 500b disposed over a semiconductor substrate 200, wherein the contact pad supporting structure 500a or 500b comprises an underlying first conductive plate 206 and an overlying second conductive plate 212, wherein the first and second conductive plates 206 and 212 are separated by a first dielectric layer 208. A plurality of circular ring-shaped via plug groups 220 or 240 comprises a plurality of circular ring-shaped via plugs 210 or 230 vertically through the first dielectric layer 208, electrically connecting to the first and second conductive plates 206 and 212, wherein all of the circular ring-shaped via plugs 210 or 230 of each of the circular ring-shaped via plug groups 220 or 240 are disorderly arranged. One exemplary embodiment of an integrated circuit of the invention may further comprise a power circuit 202 disposed between the semiconductor substrate 200 and the dielectric layer 204 and directly under the contact pad supporting structure 500a or 500b, which is used separate the semiconductor substrate 200 and the contact pad supporting structure 500a or 500b.

Advantages of the contact pad supporting structure of the invention are as follows. First, the contact pad supporting structure comprises a plurality of circular ring-shaped via plugs. Additionally, each of the circular ring-shaped via plugs may enclose a portion of the dielectric layer directly under the contact pad, thereby forming an enclosed area. When a large bonding force or device testing stress is place on the contact pad supporting structure, the circular ring-shaped via plug hinders cracking paths forming in the enclosed region of the dielectric layer and propagating substantially along a boundary between the dielectric layer and the circular ring-shaped via plugs. Because all of the circular ring-shaped via plugs of each of the circular ring-shaped via plug groups are disorderly arranged, when the pad supporting structure suffers a large bonding force or device testing stress, the arrangement of the circular ring-shaped via plug groups hinders cracking paths forming in an area of the dielectric layer among the circular ring-shaped via plugs with propagating substantially along a boundary between the dielectric layer and the circular ring-shaped via plugs by other circular ring-shaped via plugs. Additionally, the via plugs of the contact pad supporting structure of the invention are fully filled with filling materials as the circular ring-shaped via plug has a uniform width W, unlike the via plugs of conventional contact pad supporting structures. Moreover, because the mechanical strength of bonding pads of integrated circuits formed thereby are increased due to the contract pad supporting structure of the invention, power circuit may be disposed in the circuits under pad (CUP) region. Thus, the contact pad supporting structure of the invention does not hinder efficient use of space for integrated circuits, allowing for further miniaturization or increased functionality. In summary, the contact pad supporting structure of the invention has better mechanical strength, and is able to withstand a large bonding force or device testing stress when compared to conventional contact pad supporting structures, thus, allowing for further reduction in device testing costs of integrated circuits and improved fabrication yields.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A contact pad supporting structure, comprising:
    an underlying first conductive plate and an overlying second conductive plate, wherein the first and second conductive plates are separated by a first dielectric layer; and
    a plurality of circular ring-shaped via plug groups comprising a plurality of circular ring-shaped via plugs vertically through the first dielectric layer, electrically connecting to the first and second conductive plates, wherein all of the circular ring-shaped via plugs of each of the circular ring-shaped via plug groups are not arranged in an array.

2. The contact pad supporting structure as claimed in claim 1, wherein centers of each of the circular ring-shaped via plugs and centers of both of the two circular ring-shaped via plugs on opposite sides adjacent thereof are not disposed along a same line.

3. The contact pad supporting structure as claimed in claim 1, wherein the circular ring-shaped via plugs of each of the circular ring-shaped via plug groups, which are substantially along a direction, are not arranged periodically.

4. The contact pad supporting structure as claimed in claim 1, wherein each of the circular ring-shaped via plugs on a first row of the circular ring-shaped via plug groups and the two circular ring-shaped via plugs on a second row adjacent thereof are alternatively arranged to each of the circular ring-shaped via plugs on the first row.

5. The contact pad supporting structure as claimed in claim 1, wherein the circular ring-shaped via plug group comprises five circular ring-shaped via plugs arranged in a substantially pentagon shape.

6. The contact pad supporting structure as claimed in claim 1, wherein the circular ring-shaped via plug group comprises at least eight circular ring-shaped via plugs arranged in a substantially star shape.

7. The contact pad supporting structure as claimed in claim 1, wherein the circular ring-shaped via plugs have a same size.

8. The contact pad supporting structure as claimed in claim 1, further comprising:
   a semiconductor substrate disposed under the first conductive plate, wherein the semiconductor substrate and the first conductive plate are separated by a second dielectric layer; and
   a power circuit disposed between the semiconductor substrate and the second dielectric layer, wherein the power circuit is directly under the first conductive plate.

9. The contact pad supporting structure as claimed in claim 1, wherein the circular ring-shaped via plugs have widths larger or equal to the critical dimension of a via hole defined by a design rule.

10. An integrated circuit, comprising:
    a semiconductor substrate; and
    a contact pad supporting structure disposed over the semiconductor substrate, wherein the contact pad supporting structure comprises:
       an underlying first conductive plate and the overlying second conductive plate, wherein the first and second conductive plates are separated by a first dielectric layer; and
       a plurality of circular ring-shaped via plug groups comprising a plurality of circular ring-shaped via plugs vertically through the first dielectric layer, electrically connecting to the first and second conductive plates, wherein all of the circular ring-shaped via plugs of each of the circular ring-shaped via plug groups are not arranged in an array.

11. The integrated circuit as claimed in claim 10, wherein centers of each of the circular ring-shaped via plugs and centers of both of the two circular ring-shaped via plugs on opposite sides adjacent thereof are not disposed along a same line.

12. The integrated circuit as claimed in claim 10, wherein the circular ring-shaped via plugs of each of the circular ring-shaped via plug groups, which are along a direction, are not arranged periodically.

13. The integrated circuit as claimed in claim 10, wherein each of the circular ring-shaped via plugs on a first row of the circular ring-shaped via plug group and the two circular ring-shaped via plugs on a second row adjacent thereof are alternatively arranged to each of the circular ring-shaped via plugs on the first row.

14. The integrated circuit as claimed in claim 10, wherein the circular ring-shaped via plug group comprise five circular ring-shaped via plugs arranged in a substantially pentagon shape.

15. The integrated circuit as claimed in claim 10, wherein the circular ring-shaped via plug group comprise at least eight circular ring-shaped via plugs arranged in a substantially star shape.

16. The integrated circuit as claimed in claim 10, wherein the circular ring-shaped via plugs have a same size.

17. The integrated circuit as claimed in claim 10, further comprising:
    a semiconductor substrate disposed under the first conductive plate, wherein the semiconductor substrate and the first conductive plate are separated by a second dielectric layer; and
    a power circuit disposed between the semiconductor substrate and the second dielectric layer, wherein the power circuit is directly under the first conductive plate.

18. The integrated circuit as claimed in claim 10, wherein the circular ring-shaped via plugs have widths larger or equal to the critical dimension of a via hole defined by a design rule.

* * * * *